United States Patent
Lui et al.

(10) Patent No.: US 6,580,129 B2
(45) Date of Patent: Jun. 17, 2003

(54) THIN-FILM TRANSISTOR AND ITS MANUFACTURING METHOD

(75) Inventors: Basil Lui, Cambridge (GB); Piero Migliorato, Cambridge (GB); Ichio Yudasaka, Suwa (JP); Mitsutoshi Miyasaka, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/914,914

(22) PCT Filed: Jan. 2, 2001

(86) PCT No.: PCT/GB01/00013

§ 371 (c)(1),
(2), (4) Date: Dec. 13, 2001

(87) PCT Pub. No.: WO01/50512

PCT Pub. Date: Jul. 12, 2001

(65) Prior Publication Data

US 2002/0158248 A1 Oct. 31, 2002

(30) Foreign Application Priority Data

Jan. 7, 2000 (GB) .............................................. 0000379

(51) Int. Cl.⁷ .............................................. H01L 29/00
(52) U.S. Cl. ........................... 257/347; 257/59; 257/72; 257/365; 257/366; 257/331
(58) Field of Search ........................... 257/347, 59, 72, 257/365, 366, 331

(56) References Cited

U.S. PATENT DOCUMENTS

| | | | |
|---|---|---|---|
| 5,198,379 A | | 3/1993 | Adan |
| 5,250,835 A | * | 10/1993 | Izawa .......................... 357/408 |
| 5,658,808 A | | 8/1997 | Lin |
| 5,693,959 A | * | 12/1997 | Inoue et al. ................... 257/66 |
| 5,739,549 A | | 4/1998 | Takemura et al. |
| 5,895,935 A | | 4/1999 | Yamazaki et al. |
| 5,929,464 A | | 7/1999 | Yamazaki et al. |
| 6,133,609 A | * | 10/2000 | Nakamura ................... 257/347 |
| 6,388,293 B1 | * | 5/2002 | Ogura et al. ................. 257/365 |
| 2001/0025958 A1 | * | 10/2001 | Yamazaki et al. ............. 257/72 |
| 2001/0028058 A1 | * | 10/2001 | Park ............................. 257/59 |

FOREIGN PATENT DOCUMENTS

| | | | |
|---|---|---|---|
| EP | 0 348 209 A2 | | 12/1989 |
| EP | 0 359 528 A2 | | 3/1990 |
| EP | 0 589 478 A2 | | 3/1994 |
| EP | 0 723 286 A2 | | 7/1996 |
| EP | 0 738 012 A2 | | 10/1996 |
| EP | 0 795 904 A2 | | 9/1997 |
| EP | 0 797 246 A1 | | 9/1997 |
| EP | 871 227 | * | 4/1998 |
| EP | 0 871 227 A2 | | 10/1998 |
| JP | 5-110096 | * | 4/1993 |
| JP | 7-22627 | * | 1/1995 |
| JP | 2000-58849 | * | 2/2000 |
| WO | WO 96/17385 | | 6/1996 |

* cited by examiner

Primary Examiner—Nathan J. Flynn
Assistant Examiner—Ahmed N. Sefer
(74) Attorney, Agent, or Firm—Oliff & Berridge, PLC

(57) ABSTRACT

The present invention provides, in a TFT, a gate electrode and a channel domain that are plurally divided in the channel-length direction, a low-concentration domain that is formed between the divided channel domains, and a low-concentration drain domain that adjoins a second channel domain located closest to a drain domain side among the divided channel domains. Therefore, even if the impurity concentration is relatively high in the low-concentration domain located between the divided channel domains and a low-concentration drain domain, an abnormal increase of drain current in the saturated region can be prevented, and a TFT with a high drain current level can be obtained. Thus, the present invention provides a TFT and its manufacturing method where abnormal increase of drain current in the saturated region can be prevented and the drain current level in the saturated region is sufficiently high.

12 Claims, 8 Drawing Sheets

(A)

(B)

(A)

(B)

THIN-FILM TRANSISTOR AND ITS MANUFACTURING METHOD

This invention relates to a thin-film transistor (called TFT below) and its manufacturing method. More specifically, it relates to structural technology for improving the transistor property of TFTs.

The various kinds of devices which use TFTs include an active matrix substrate for a liquid-crystal display which is formed on a transparent substrate such as one made of glass and roughly the central domain is made to be the screen display domain 81 as shown in FIG. 5 (A). In this screen display domain 81, pixels are formed with data lines 90 and scan lines 91 made of metal film such as aluminum, tantalum, molybdenum, titanium, and tungsten, silicide film, and conductive semiconductor film. On each pixel, a liquid-crystal unit 94 (liquid-crystal cell) is formed where image signals are input via a TFT 30 for image switching. For the data line 90, a data-side driving circuit 60 is constructed that is equipped with a shift register 84, a level shifter 85, a video line 87, and an analog switch 86. A scan-side driving circuit 70 equipped with a shift register 88 and a level shifter 89 are constructed for the scan line 91. On each pixel, a retention capacitor 40 is formed connected to a capacity line 92 running in parallel with the scan line 91, and this retention capacitor 40 has a function of increasing the charge retention property of the liquid-crystal unit 94. This retention capacitor 40 may be formed between a scan line 91 of the previous row and a pixel electrode.

As shown in FIG. 5(B), a CMOS circuit is constructed in the data-side and scan-side driving circuits 60 and 70, with an N-type TPT 10 and a P-type TFT 20. This kind of CMOS circuit forms an inverter circuit etc. in the driving circuits 60 and 70 with one row, two rows or more.

Therefore, in an active-matrix substrate 200, on the front side of the substrate, three kinds of TFTs are formed consisting of an N-type TFT 10 for the driving circuit, a P-type TFT 20 for the driving circuit, and an N-type TFT 30 for image switching. Here, these TFTs 10, 20, and 30 have a common basic structure and manufacturing method. Therefore, to avoid duplication of explanation, the structure and manufacturing method of the N-type TFT 10 for the driving circuit are explained with reference to FIG. 6, FIG. 7, and FIG. 8.

As shown in FIG. 6(A), in an active-matrix substrate, an insulating matrix protection film 301 is formed on the surface of a transparent substrate 30 as the base body, and a polycrystalline semiconductor film 10a (semiconductor film) is formed on the surface of this matrix protection film 301 such as polysilicon of a thickness of 50 nm for example for forming the TFT 10. On the surface of the semiconductor film 10a, a gate insulation film 13 is formed with a film thickness of 100 nm for example, and on the surface of this gate insulation film 13, a gate electrode 19 is formed. Out of the semiconductor film 10a, the domain facing the gate electrode 19 across the gate insulation film 13 is a channel domain 15 with a channel length of 5 $\mu$m for example. On one side of this channel domain 15, a source domain is formed that is equipped with a low-concentration source domain 161 and a high-concentration source domain 162, and on the other side, a drain domain 17 is formed that is equipped with a low-concentration drain domain 171 and a high-concentration drain domain 172. On the front side of thus-constructed TFT 10, an interlayer insulation film 18 is formed, and a source electrode 12 formed on this interlayer insulation film 18 is electrically connected to the high-concentration source domain 162 via a contact hole 18a formed on the interlayer insulation film 18. Also, a drain electrode 14 is formed on the surface of the interlayer insulation film 18, and this drain electrode 14 is electrically connected to the high-concentration drain domain 172 via a contact hole 18b formed on the interlayer insulation film 18.

In order to manufacture thus-constructed TFT 10, as shown in FIG. 7(A), firstly a matrix protection film 301 is formed on the surface of an insulation substrate 30, and then on the entire surface of this matrix protection film, a semiconductor film 100 is formed that is made of polysilicon film of thickness 50 nm for example.

Next, a resist mask RM11 is formed on the surface of the semiconductor film 100 using the photolithography technology.

Next, a semiconductor film 1 is patterned via the resist mask RM11, and as shown in FIG. 7(B), an island-shape semiconductor film 10a (active layer) is formed.

Next, as shown in FIG. 7(C), on the surface of the semiconductor film 10a, the gate insulation film 13 is formed and is made of a silicon oxidization film with a thickness of 100 nm for example.

Next, as shown in FIG. 7(D), on the entire surface of the insulation substrate 30, a tantalum film 910 is formed which is for forming a gate electrode etc., and additionally a resist mask RM12 is formed using the photolithography technology.

Next, the tantalum film 910 is patterned via the resist mask RM12, and as shown in FIG. 7(E), a gate electrode 19 is formed of a dimension of 5 $\mu$m in the channel-length direction.

Next, as shown in FIG. 7(F), low-concentration impurity ions (phosphorus ions) are implanted with a dose of $0.1 \times 10^{13}/cm^2$ to $10 \times 10^{13}/cm^2$ with the gate electrode 19 as a mask, forming a low-concentration source domain 161 and a low-concentration drain domain 171 self-aligned to the gate electrode. Here, the part where the impurity ions were not introduced because it was located right beneath the gate electrode remains as a semiconductor film and becomes a channel domain 15 of a channel length of 5 $\mu$m.

Next, as shown in FIG. 8(A), a resist mask RM13 is formed that is wider at one side closer to the gate electrode, and high-concentration impurity ions (phosphorus ions) are implanted with a dose of $0.1 \times 10^{15}/cm^2$ to $10 \times 10^{15}/cm^2$, forming a high-concentration source domain 162 and drain domain 172. In this way, as shown in FIG. 8(B), a source domain 16 is formed that is equipped with the low-concentration source domain 161 and the high-concentration source domain 162, and a drain domain 17 is also formed that is equipped with the low-concentration drain domain 171 and the high-concentration drain domain 172.

Next, as shown in FIG. 8(C), an interlayer insulation film 18 is formed, and then on the interlayer insulation film 18 on the front side of the gate electrode 19, and a resist mask RM14 is formed using the photolithography technology for forming a contact hole.

Next, the interlayer insulation film 18 is etched via the resist mask RM14, and as shown in FIG. 8(D), contact holes 18a and 18b are respectively formed on the parts of the interlayer insulation film 18 corresponding to the high-concentration source domain 162 and the high-concentration drain domain 172.

Next, as shown in FIG. 8(E), an aluminum film 900 is formed on the front side of the interlayer insulation film 18 by the sputtering method etc. for constructing a source electrode etc., and additionally a resist mask RM15 is formed using the photolithography technology.

Next, the aluminum 900 is etched via a resist mask RM15, and as shown in FIG. 6(A), a source electrode 12 is formed that is made of an aluminum film electrically connected to the high-concentration source domain 162 via the contact hole 18a, and a drain electrode 14 is formed that is electrically connected to the high-concentration drain domain 172 via the contact hole 18b.

Among such manufacturing processes, in the manufacturing process shown in FIG. 8(A), if the resist mask RM 13 is formed more widely only on the side where the drain domain 17 should be formed, as shown in FIG. 6(B), a TFT 10 can be manufactured where the low-concentration drain domain 171 exists in a domain facing the edge of the gate electrode 19 across the gate insulation film 13 on the drain domain 17 side but the high-concentration source domain 162 is formed self-aligned to the gate electrode 19 on the source domain 16 side. Because the rest of the construction in this TFT is the same with the TFT shown in FIG. 6(A), the same references are assigned to the common parts in FIG. 6(B), and their explanations are omitted.

Also, in the manufacturing process shown in FIG. 7(F), if high-concentration impurity is introduced instead of low-concentration impurity and the high-concentration source domain 162 and the high-concentration drain domain 172 are formed to be self-aligned to the gate electrode 19, a TFT 10 with a self-aligning structure can be manufactured as shown in FIG. 6(C). The rest of the construction in this TFT is also the same with the TFT shown in FIG. 6(A), the same references are assigned to the common parts in FIG. 6(C), and their explanations are omitted.

In a TFT 10 constructed in this way, a positive drain voltage relative to the source electrode 12 voltage is charged to the drain electrode 14, and a positive gate voltage is charged to the gate electrode 19. As the result, negative charge is concentrated on the interface between the channel domain 15 and the gate insulation film 13, and an N-type channel (inversion layer) is formed. At this time, when the drain voltage is small enough compared with the gate voltage, because the source domain 16 and the drain domain 17 are connected via a channel, the drain current increases as the drain voltage increases (unsaturated region) in the transistor property (current-voltage property) shown in FIG. 2(A). On the other hand, when the drain voltage becomes high enough to be very close to the gate voltage, the density of excited electrons becomes small near the drain domain 17, causing a pinch-off. Under this condition, even if the drain voltage is increased more, the drain current does not increase but becomes almost constant (a saturated region). The current value at this time is called the saturation current. Therefore, if TFT 10 is driven utilizing this saturated region, because a constant drain current can be obtained, destruction of the TFT 10 itself or surrounding circuits due to excessive current can be prevented.

However, none of the conventional TFTs shown in FIGS. 6(A), (B), and (C) has sufficient electrical properties, thus requiring further improvement.

For example, in a TFT 10 with a self-aligning structure shown in FIG. 6(C), when the drain voltage becomes high, a phenomenon (kink effect) occurs where said drain current that is supposed to be constant in the saturated region increases abnormally. The reason is as follows. First of all, when the drain voltage becomes high and the electric field between the source and the drain becomes strong, each carrier is accelerated by this electric field and comes to have large energy. Because each carrier is accelerated from the source domain 16 toward the drain domain 17, they come to have the maximum energy near the drain domain 17. A carrier with a large energy (hot carrier) collides with an atom of the semiconductor film 10a or an impurity atom and generates a pair of an electron and hole. Because the generated hole increases the voltage of the channel domain 15, the current corresponding to the injection of said hole flows from the channel domain 15 to the source domain 16. This kind of phenomenon can be understood by assuming that the channel domain 15 corresponds to the base, the source domain 16 emitter, and the drain domain 17 collector. Also, the hole current flowing from the channel domain 15 to the source domain 16 can be considered to be the base current, and the current flowing from the source domain 16 to the drain domain 17 in response to this current flowing from the channel domain 15 to the source domain 16 can be considered to be the collector current. Therefore, this phenomenon is also called bipolar action. Because of this bipolar-transistor-like behavior (bipolar action), even in the saturated region, as the drain voltage increases, the drain current rapidly increases (kink effect) as the transistor property is shown in a solid line L1 in FIG. 2(A) in conventional TFTs. As a result, the TFT itself or the surrounding circuits can be destroyed due to excessive current. Furthermore, because this kind of phenomenon becomes more significant as crystallinity of the semiconductor film 10a is increased and the drain current level of the TFT 10 is increased, conventional TFTs tend to have decreasing reliability with a higher drain current level.

On the other hand, as shown in FIG. 6(B), among the TFTs 10 that have a low-concentration drain domain 171 in the drain domain 17, in the TFT 10 where the channel length is 5 μm and impurity concentration in the low-concentration drain domain 171 is $3\times10^{17}$ cm$^{-3}$, although the kink effect seen in a self-align-structure TFTs is improved as per the transistor property shown in a dotted broken line L2 in FIG. 2(A), it has not been sufficiently improved yet.

On the other hand, in the TFT 10 shown in FIG. 6(B), when the channel length is made 5 μm and impurity concentration of the low-concentration drain domain 171 is lowered to $1\times10^{17}$ cm$^{-3}$, as the transistor property shown in a double-dotted broken line L3 in FIG. 2(A), the kink effect seen in self-align-structure TFTs can be sufficiently improved. However, in the TFT 10 shown in FIG. 6(B), if impurity concentration in the low-concentration drain domain 171 is lowered to $1\times10^{17}$ cm$^{-3}$, the drain current becomes too low, and if this TFT 10 is used in a driving circuit etc., a problem occurs that the operation speed becomes significantly lower.

An objective of this invention is to provide a TFT and its manufacturing method that prevent an abnormal increase of the drain current in the saturated region, where the drain current level in the saturated region is sufficiently high.

In order to solve said problem, in a TFT where a channel domain facing a gate electrode across a gate insulation film and a source/drain domain connected to the channel domain are formed on a semiconductor film formed on the surface of an insulating substrate, this invention may be characterized as follows. Said gate electrode and said channel domain are divided plurally in the channel-length direction. Between the divided channel domains, a low-concentration domain is formed that consists of a semiconductor film with a low impurity concentration. A low-concentration drain domain with a low impurity concentration adjoins the channel domain located closest to the drain-domain side among said divided channel domains.

According to the experiments the inventor of this application performed, the following knowledge was obtained. In a TFT where the gate electrode and the channel domain are divided plurally in the channel length direction, the low-concentration domain is formed between the divided channel domains, and a low-concentration drain domain with a low impurity concentration adjoins the channel domain located closest to the drain domain among the divided channels, even if impurity concentration is relatively high in the low-concentration domain located between the divided channel domains and the low-concentration drain domain, abnormal increase of the drain current in the saturated region can be prevented. Therefore, in a TFT according to this invention, because there is no need to lower the impurity concentration in the low-concentration domain located between the divided channel domains and the low-concentration drain domain to the extent where the drain current becomes low as for the TFT whose transistor property is shown in a double-dotted broken line L3 in FIG. 2(A), stable drain current can be obtained in the saturated region, and this drain current level is high. Therefore, a TFT that is more reliable and can achieve a high-speed operation when used in a driving circuit can be realized.

In this invention, the domain where said source domain adjoins said channel domain should be preferably a high-concentration source domain. Namely, because electric-field intensity in the drain domain should be reduced in order to prevent effectively the occurrence of the kink effect, it is preferable that only the drain-domain side is made in the LDD structure and the source-domain side is made in the self-aligning structure, thereby obtaining a higher level of drain current.

In this invention, for example, the channel-length-direction dimension of said low-concentration drain domain and the channel-length-direction dimension of said low-concentration domain located between said channel domains are made approximately equal to each other.

In this invention, among said divided gate electrodes and channel domains, the channel-length-direction dimensions of the gate electrode and channel domain located in the drain-domain side should be preferably shorter than the channel-length-direction dimension of the gate electrode and channel domain located in the source-domain side. Namely, from the viewpoint of reducing electric-field intensity in the drain-domain side, it is preferable to form the low-concentration domain located between said channel domains near the drain domain For example, said gate electrode and channel domain are divided in two so that the ratio between the channel-length-direction dimension of the gate electrode and the channel domain located in the drain-domain side and the channel-length-dimension of the gate electrode and the channel domain located in the source-domain side becomes 1:2 to 1:10.

In this invention, impurity concentration of said low-concentration domain and said low-concentration drain domain is, for example, $3\times10^{17}$ cm$^{-3}$ to $3\times10^{19}$ cm$^{-3}$, preferably $1\times10^{18}$ cm$^{-3}$ to $3\times10^{19}$ cm$^{-3}$.

In order to manufacture a MFT of this kind of construction, after sequentially forming a semiconductor film and a gate insulation film, a gate electrode is formed that is divided plurally in the channel-length direction, on the surface of the gate insulation film. After that, by introducing low-concentration impurity to said semiconductor film using the gate electrode as a mask, plural channel domains are formed that are divided in the channel-length direction, on said semiconductor film.

Embodiments of the present invention will now be described by way of further example only and with reference to the accompanying drawings, in which:

FIG. 1 is a cross-sectional view showing the construction of a TFT according to the present invention.

FIGS. 2(A) and (3) are figures showing transistor properties of a TFT according to the present invention and a conventional TFT, respectively.

Figure 5:
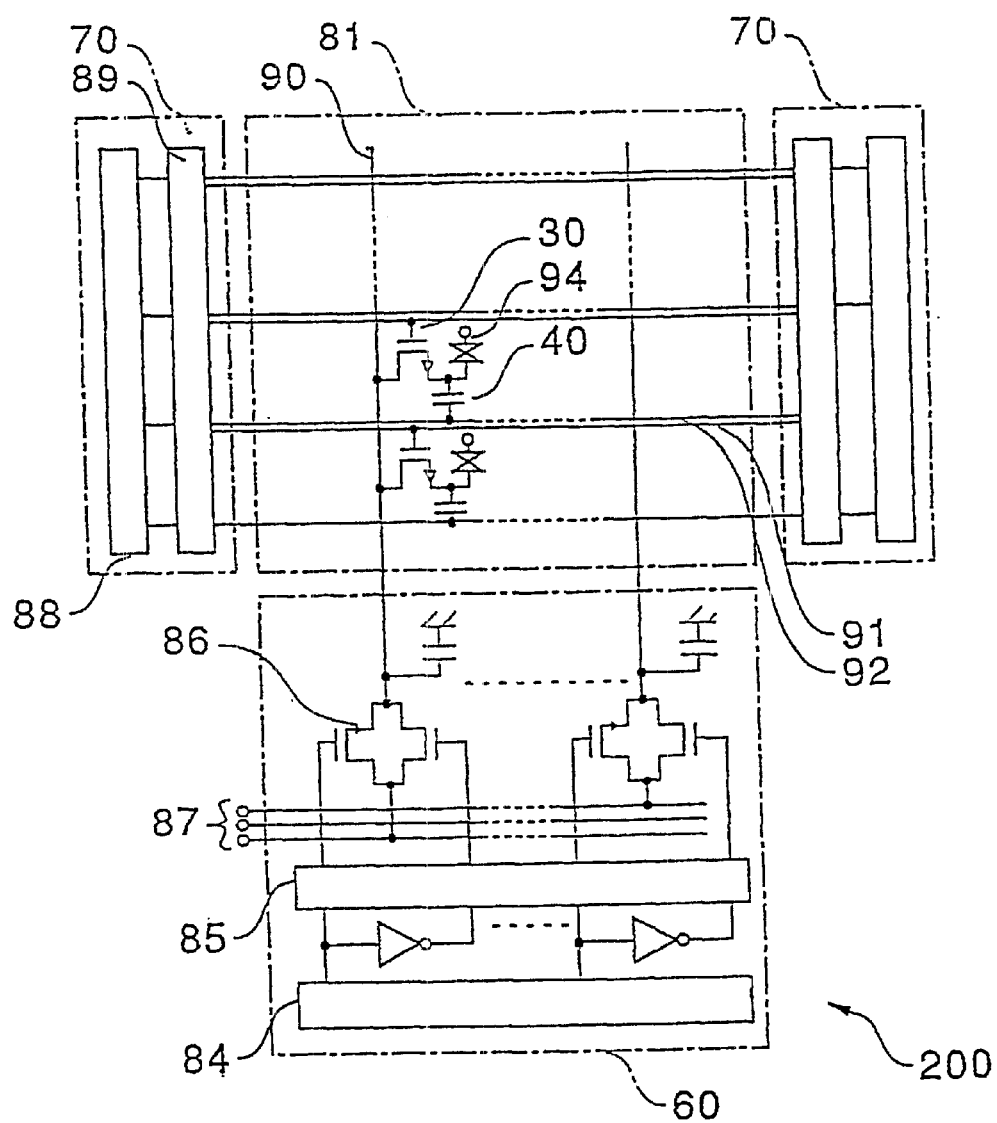
Figure 5:
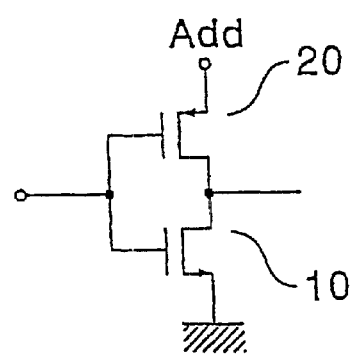

FIGS. 5(A) and (B) are a block diagram of an active-matrix substrate for liquid-crystal displays and an equivalent-circuit diagram formed on it, respectively.

Figure 6:
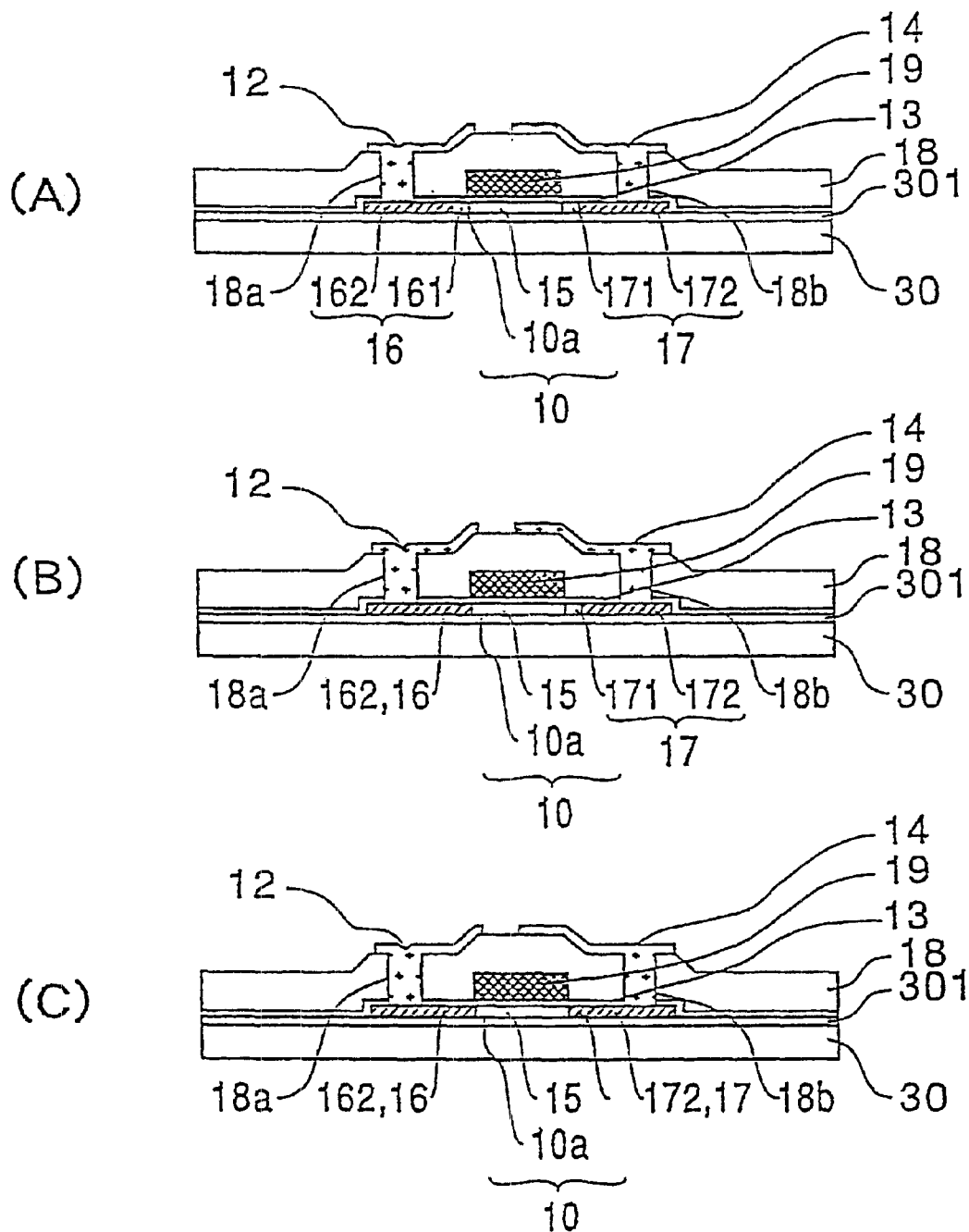

FIGS. 6(A), (B), and (C) are a cross-sectional view of the conventional LDD-structure TFT, a cross-sectional view of a TFT that has an LDD-structure on one side only, and a cross-sectional view showing the structure of the self-align-structure TFT.

Figure 7:
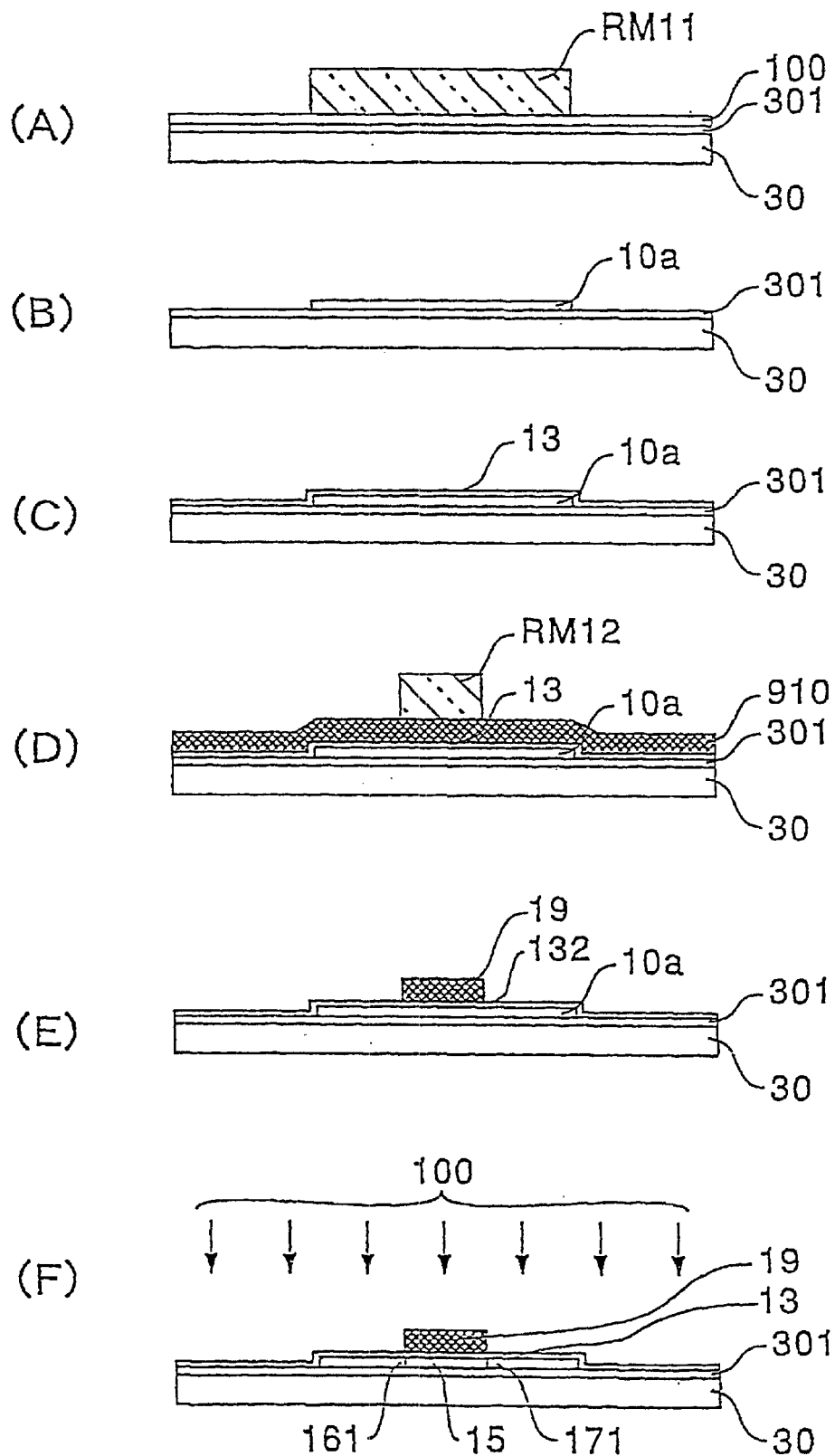

FIG. 7 is a manufacturing-process cross-sectional view showing the manufacturing method of the TFT shown in FIG. 6(A).

Figure 8:
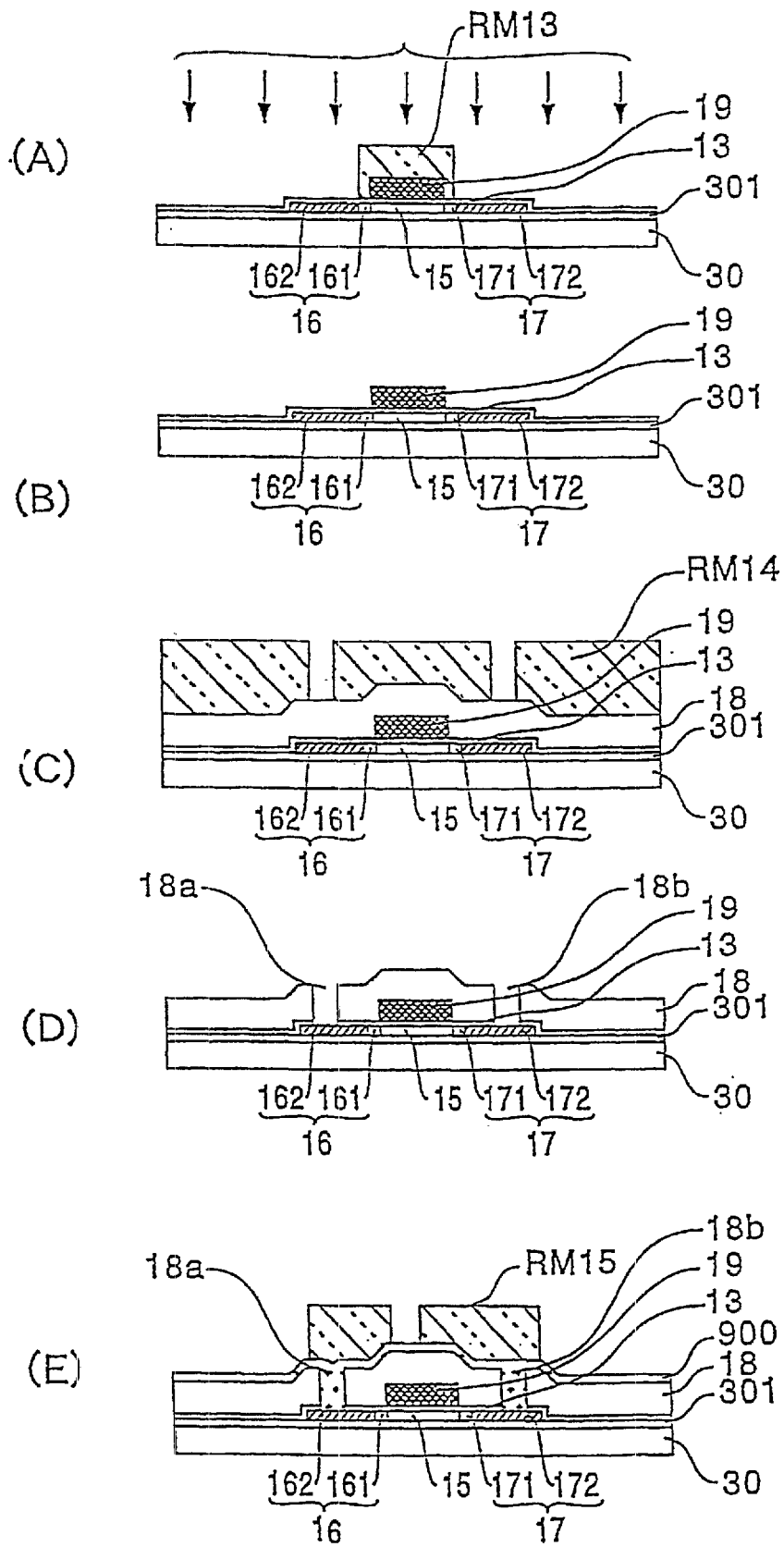

FIG. 8 is a manufacturing-process cross-sectional view showing a process that follows the process shown in FIG. 7.

A TFT according to the present invention may be used for image switching on active-matrix substrates for liquid-crystal displays or for driving circuits for example. Here, the TFT for driving circuits and the TFT for image switching have a common basic structure and manufacturing method. Also, the TFT according to the present invention has certain basic structures and manufacturing processes in common with conventional TFTs. Therefore, in the following explanations, identical references are assigned to the common elements with the conventional TFTs and their manufacturing method to prevent duplication of explanation, and only the structure of the N-type TFT for driving circuits and its manufacturing method are explained.

Figure 1:
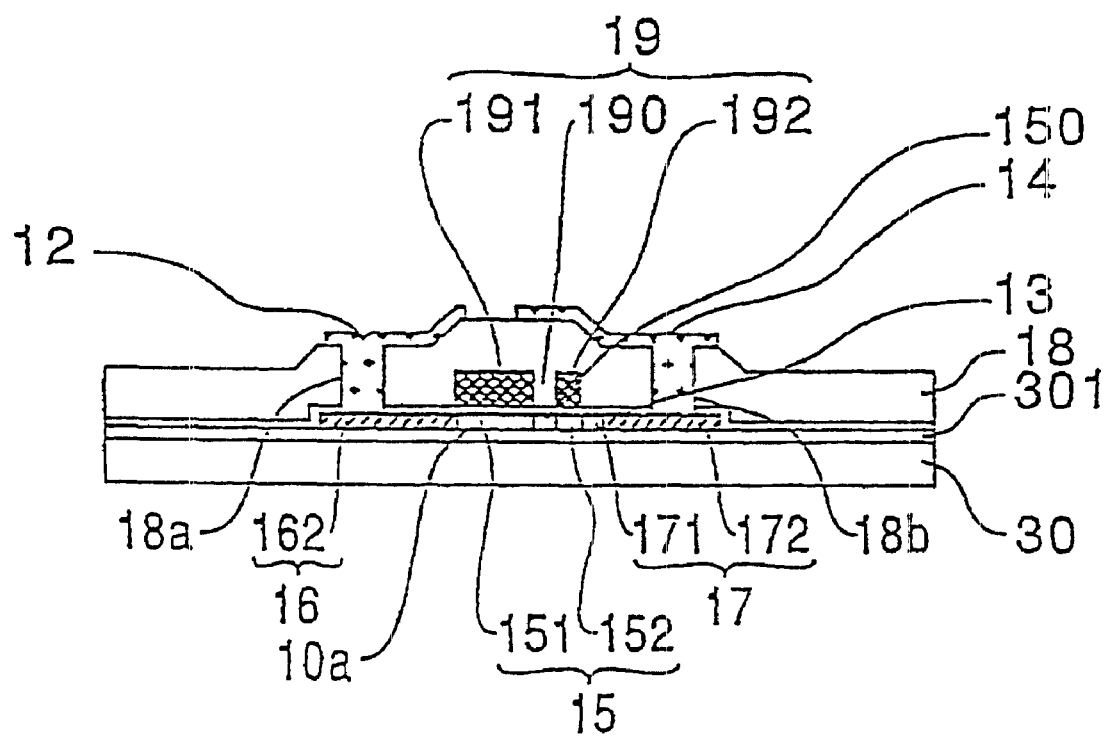

As shown in FIG. 1, in an active-matrix substrate according to this invention, on the surface of a transparent substrate 30 as the base body, an insulating matrix protection film 301 is formed that is made of silicon oxidization film, and on the surface of this matrix protection film 301, a semiconductor film 10a for forming a TFT 10 is formed with 50 nm thickness for example. On the surface of the semiconductor film 10a, a gate insulation film 13 is formed with 100 nm thickness for example, and a gate electrode 19 is formed on the surface of this gate insulation film 13. Out of the semiconductor film 10a, the domain facing the gate electrode 19 across the gate insulation film 13 is made a channel domain 15.

In this embodiment, the gate electrode 19 is divided in two in the channel-length direction, consisting of the first gate electrode 191 located in the source side and the second gate electrode 192 located in the drain side. A space 190 is formed between these two gate electrodes 191 and 192, and this space 190 is filled with an interlayer insulation film 18. Here, the same gate voltage is charged because the gate electrodes 191 and 192 are electrically connected with each other.

The channel domain 15 is also divided in two in the channel-length direction, consisting of the first channel domain 151 facing the first gate electrode 191 across the gate insulation film 13 in the source side and the second channel domain 152 facing the second gate electrode 192 across the gate insulation film 13 in the drain side. A low-concentration domain 150 is formed between these two channel domains 151 and 152.

Here, among the divided first and second gate electrodes 191 and 192, the channel-length-direction dimension of the first gate electrode 191 located in the source side is 4 µm, and the channel-length-direction dimension of the second gate electrode 192 located in the drain side is 1 μm. In this case, the total of the divided first and second gate electrodes 191 and 192 is 5 μm. Also, among the divided first and second channel domains 151 and 152, the channel-length-direction dimension of the first channel domain 151 located in the source side is 4 μm, and the channel-length-direction dimension of the second channel domain 152 located in the drain side is 1 μm. Therefore, the channel-length-direction dimension of the second gate electrode 192 and the second channel domain 152 located in the drain side are shorter than the channel-length-direction dimension of the first gate electrode 191 and the first channel domain 151, and the ratio is 1:4.

Also, the channel-length-direction dimension of the space 190 dividing the gate electrode 19 in two and the low-concentration domain 150 located between the divided channel domains 15 is 1 μm.

In this embodiment also, a source domain 16 and a drain domain 17 are formed on the sides of the channel domain 15. Among these source domain 16 and drain domain 17, the source domain 16 consists only of a high-concentration source domain 162, and this high-concentration source domain 162 is formed self-aligned to the gate electrode 15. Therefore, the high-concentration source domain 162 adjoins the source side of the channel domain 15. On the other hand, the drain domain 17 consists of a low-concentration drain domain 171 adjoining the second channel domain 152 and a high-concentration drain domain 172 adjoining this low-concentration drain domain 171, and has an LDD structure. Here, the channel-length-direction dimension of the low-concentration source/drain domain 171 (LDD length) is 1 μm, which is equal to the channel-length-direction dimension of a low-concentration domain 150 located between the channel domains 15. Also, impurity concentration of the low-concentration domain 150 and the low-concentration drain domain 171 are both $3 \times 10^{17}$ $cm^{-3}$.

An interlayer insulation film 18 is formed on the front side of thus-constructed TFT 10, and a source electrode 12 formed on this interlayer insulation film 18 is connected to the high-concentration source domain 162 via a contact hole 18a formed on the interlayer insulation film 18. Also, a drain electrode 14 is also formed on the interlayer insulation film 18, and this drain electrode 14 is electrically connected to the high-concentration drain domain 172 via a contact hole 18b formed on the interlayer insulation film 18.

As for a TFT 10 constructed in this way, the result of simulating its transistor property is shown in a dotted line L4 in FIG. 2(A). As seen in this figure, even in the TFT 10 of this embodiment, the drain current increases as the drain voltage increases in the unsaturated region where the drain voltage is low enough compared with the gate voltage. Also, when the drain voltage becomes so high as to be very close to the gate voltage and a pinch-off occurs, no kink effect occurs unlike a self-aligning TFT whose transistor property is shown in a solid line L1 in FIG. 2(A) or an LDD-structure TFT shown in a dotted broken line L2 (impurity concentration in the low-concentration drain domain is $3 \times 10^{17}$ $cm^{-3}$), and even if the drain voltage is increased more, the drain current does not increase and remains almost constant (a saturated region). Therefore, if the saturated region of the TFT 10 in this embodiment is utilized, because a constant drain current can be obtained, destruction of TFT 10 itself or surrounding circuits due to excessive current can be prevented.

Figure 2:
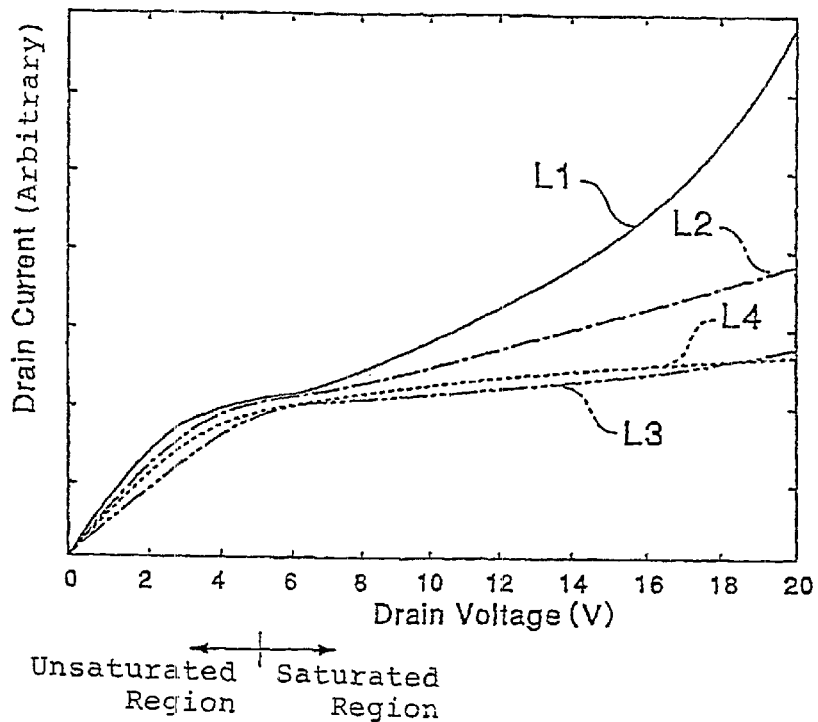
Figure 2:
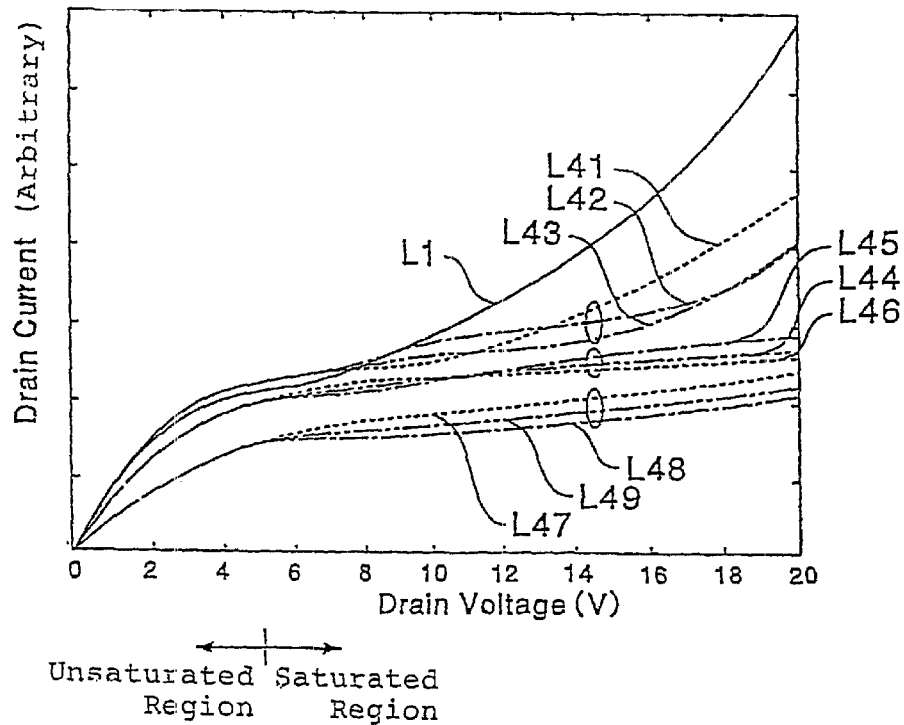

Also, as the transistor property is shown in a double-dotted broken line L3 in FIG. 2 (A), in a conventional LDD-structure TFT, the occurrence of a kink effect could not be prevented unless impurity concentration in the low-concentration drain domain is lowered to $1 \times 10^{17}$ $cm^{-3}$. However, in the TFT 10 in this embodiment, the occurrence of a kink effect can be prevented just by lowering the impurity concentration in the low-concentration domain 150 located between the divided channel domains 15 and the low-concentration drain domain 171 to $3 \times 10^{17}$ $cm^{-3}$, having a high level of drain current in the saturated region.

In this way, in the TFT 10 in this embodiment, a gate electrode 19 and a channel domain 15 are divided plurally in the channel-length direction, a low-concentration domain 150 is formed between the divided channel domains, and a low concentration drain domain 162 adjoins the second channel domain 152 located closest to the drain-domain 17 side among the divided channel domains 15. Also, from the viewpoint that electric-field intensity in the drain domain 17 should be reduced in order to effectively prevent the occurrence of a kink effect, only the drain-domain 17 side is made in an LDD structure, and the source-domain 16 side is made in a self-aligning structure to retain a large drain current. Furthermore, from the viewpoint of effectively reducing electric-field intensity in the drain-domain 17 side, division positions of the gate electrode 19 and the channel domain 15 are optimized, and the low-concentration domain 150 that divides the channel domain 15 is arranged close to the drain domain 17. Because of this, even if impurity concentrations in the low-concentration domain 150 located between the divided channel regions 15 and the low-concentration drain domain 161 are relatively high, abnormal increase of drain current in the saturated region can be prevented. Also, because impurity concentrations in the low-concentration domain 150 located between the divided channel domains 15 and the low-concentration drain domain 161 are relatively high, the drain current level is high.

FIG. 2(B) shows simulation results of the transistor property for the TFT with a construction shown in FIG. 1, for the cases where length of the space 190 is set to 0.5 μm, 1.0 μm, and 1.5 μm, impurity concentration in the low-concentration domain 150 and the low-concentration drain domain 171 is set $1 \times 10^{17}$ $cm^{-3}$, $3 \times 10^{17}$ $cm^{-3}$, and $1 \times 10^{19}$ $cm^{-3}$. Here, because the total length of the divided first and second gate electrodes 191 and 192 are set constant at 5 μm, corresponding to the space 190 length 0.5 μm, 1.0 μm, and 1.5 μm, the length of the first gate electrode 191 and the second gate electrode 192 become 4.5 μm and 0.5 μm, 4.0 μm and 1.0 μm, and 3.5 μm and 1.5 μm, respectively. In FIG. 2(B), broken lines L41, L44, and L47 indicate the transistor property when the space 190 length is 0.5 μm and the impurity concentration in the low-concentration domain 150 and the low-concentration drain domain 171 are $1 \times 10^{17}$ $cm^{-3}$, $3 \times 10^{17}$ $cm^{-3}$, and $1 \times 10^{19}$ $cm^{-3}$, respectively, dotted broken lines L42, L45, and L48 indicate the transistor property when the space 190 length is 1.0 μm and impurity concentration in the low-concentration domain 150 and the low-concentration drain domain 171 are $\times 10^{17}$ $cm^{-3}$, $3 \times 10^{17}$ $cm^{-3}$, and $1 \times 10^{19}$ $cm^{-3}$, respectively, and double-dotted broken lines L43, L46, and L49 indicate transistor property when the space 190 length is 1.5 μm and impurity concentration in the low-concentration domain 150 and the low-concentration drain domain 171 are $1 \times 10^{17}$ $cm^{-3}$, $3 \times 10^{17}$ $cm^{-3}$, and $1 \times 10^{19}$ $cm^{-3}$, respectively. Here, in FIG. 2(B), the result of simulating the transistor property of a normal self-aligning TFT is shown in a solid line Li for reference (the gate length is 5 μm).

As is clear in FIG. 2(B), although the drain current shows a large increase when the drain voltage is 8 V or higher in a self-aligning TFT, there is no large increase in the drain current until the drain voltage becomes 20 V in a TFT with the divided gate electrode structure when impurity concentration in said low-concentration domain is $1\times10^{17}$ cm$^{-3}$ and $3\times10^{17}$ cm$^{-3}$, and there is no large drain current increase until the drain voltage becomes 12 V even when the impurity concentration of said low-concentration domain is $1\times10^{19}$ cm$^{-3}$. Also, when the concentration of the impurity domain in said low-concentration domain is $1\times10^{19}$ cm$^{-3}$, the TFT with the divided gate electrode structure obtains a larger drain current than the self-aligning TFT in the unsaturated region. Here, as a result of further simulation, it turns out that the kink effect is suppressed and the drain current shows significantly larger drain current than the self-aligning TFT in the unsaturated region when an impurity concentration of said low-concentration impurity domain is $1\times10^{18}$ cm$^{-3}$ to $3\times10^{19}$ cm$^{-3}$.

Therefore, a TFT 10 that is highly reliable and can achieve high-speed operation when used for driving circuits can be realized according to this embodiment.

Figure 3:
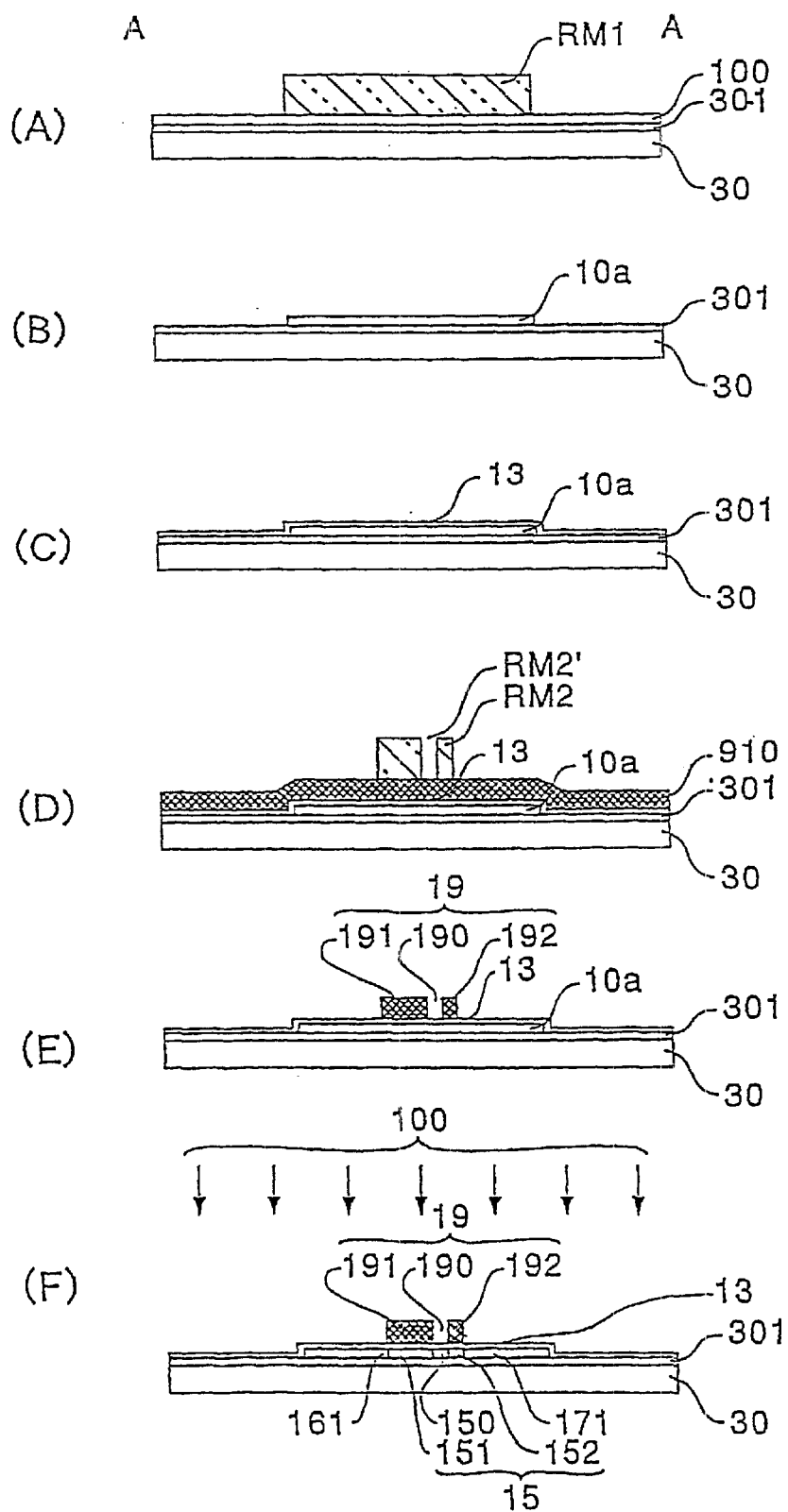
FIG. 3 is a manufacturing-process cross-sectional view showing the manufacturing method of a TFT according to the present invention.
Figure 4:
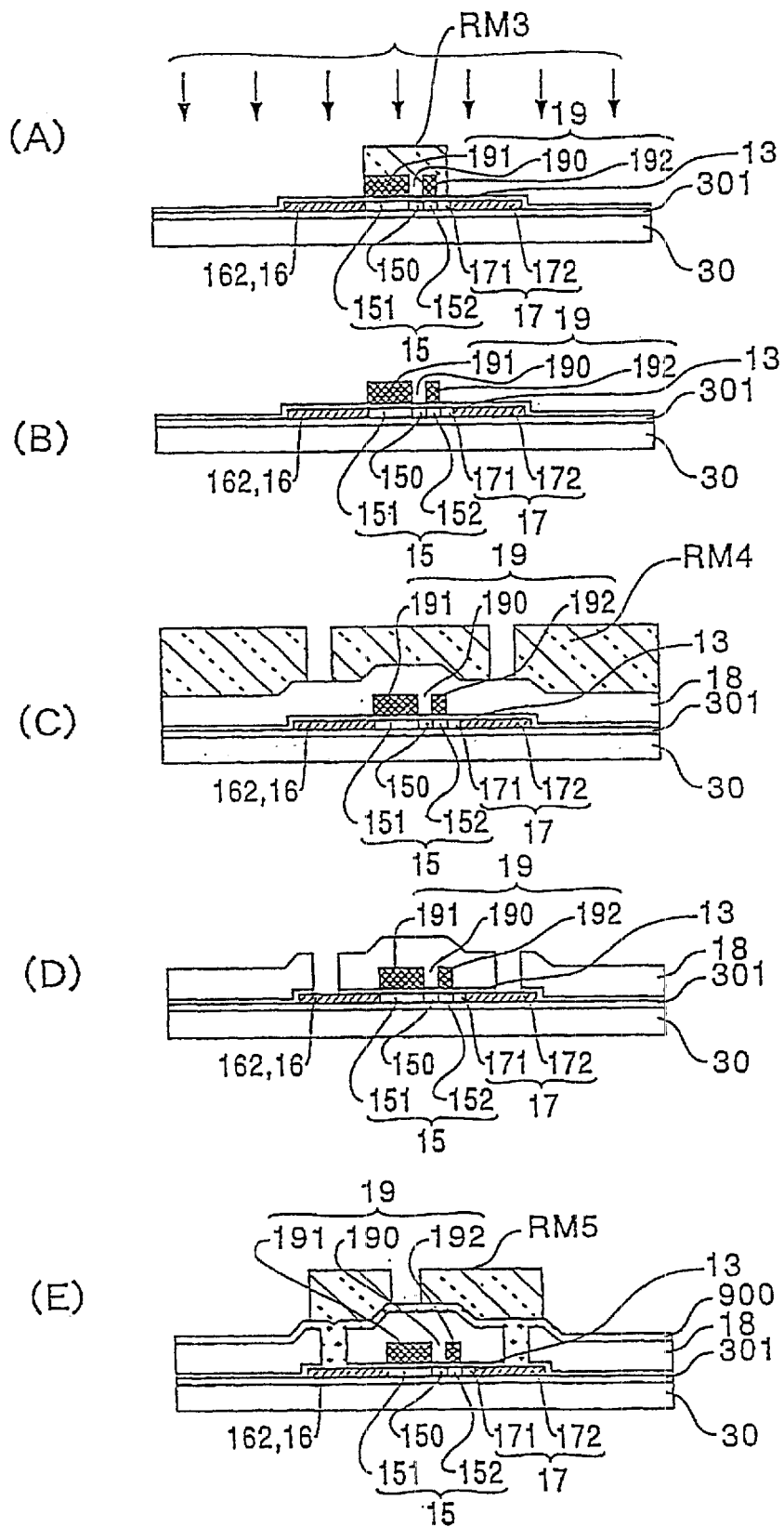
FIG. 4 is a manufacturing-process cross-sectional view showing a process that follows the process shown in FIG. 3.

A method of manufacturing a TFT constructed in this way is explained referring FIG. 3 and FIG. 4. Both FIG. 3 and FIG. 4 are manufacturing-process cross-sectional views showing the manufacturing method of the TFT in this embodiment.

First of all, as shown in FIG. 3(A), on the surface of a transparent insulation substrate 30 made of non-alkaline glass, quartz, etc., a matrix protection film 301 is formed that is made of silicon oxidization film, and then on the entire surface of this matrix protection film 30, a semiconductor film 100 is formed that is made of polysilicon film of a thickness of about 20 nm to 200 nm, about 50 nm for example, by using the depressurized CVD method etc.

In forming this kind of polycrystalline semiconductor film 100, thermal deformation of the insulation substrate 30 is prevented by using a low-temperature process. The low-temperature process is the one where the maximum temperature of the manufacturing process (maximum temperature to which the entire substrate heats up) is approximately below 600° C. (preferably approximately below 500° C.). On the other hand, the high-temperature process is the one where the maximum temperature of manufacturing process (maximum temperature to which the entire substrate heats up) is approximately 700° C. or higher, which is to perform high-temperature manufacturing processes at 700° C. to 1200° C. such as forming film under a high temperature, thermal oxidation of silicon, etc.

However, in the low-temperature process, because it is difficult to form a polycrystalline semiconductor film of high crystallinity directly on the substrate, first of all an amorphous semiconductor 100 needs to be formed using the plasma CVD method or the low-pressure CVD method, and then this semiconductor film 100 needs to be crystallized as is explained below. As the method of this crystallization, while there are the SPC method (Solid Phase Crystallization), RTA method (Rapid Thermal Annealing), etc., if laser annealing by irradiating an excimer laser beam using XeCl (ELA: Excimer Laser Annealing/Crystallization Process) is used, temperature increase of the substrate can be suppressed and a large-grain-size polycrystalline semiconductor film can be obtained.

In this crystallization process, a laser beam (excimer laser) emitted from a laser source is irradiated toward the insulation substrate 30 via an optical system. At this time, a line beam with a long irradiation region along the substrate width direction is irradiated onto the semiconductor film 100, and the irradiation region is shifted in the substrate length direction. Here, in shifting the irradiation region of the laser beam, it is shifted by a specified distance so that the laser irradiation regions partially overlap. As the result, the amorphous semiconductor film 100 is partially melted, and polycrystallizes through a cooling and solidification process. At this time, because the irradiation time of laser beam onto each region is very short and the irradiation region is partial to the whole substrate, the insulation substrate 30 as a whole is not heated up to a high temperature at the same time. Therefore, when a glass substrate is used as the insulation substrate 30, there is no deformation or cracks due to heat although the glass substrate is more heat resistant than quartz substrate.

Next, a resist mask RM1 is formed on the surface of the semiconductor film 100 by using photolithography technology.

Next, a semiconductor film 1 is patterned via the resist mask RM1, and as shown in FIG. 3(B), an island-shape semiconductor film 10a (active layer) is formed.

Next, as shown in FIG. 3(C), a gate insulation film 13 is formed on the surface of the semiconductor film 10a and is made of silicon oxidization film of a thickness of about 50 nm to 150 nm, 100 nm for example, by the CVD method etc. Also, silicon nitride film can be used as the gate insulation film 13.

Next, as shown in FIG. 3(D), a tantalum film 910 is formed on the entire surface of the insulation substrate 30, that is for forming a gate electrode etc., and additionally, a resist mask RM2 is formed using photolithography technology. On this resist mask RM2, an opening RM2' is also formed at a location corresponding to a space 190 that divides the gate electrode 19 explained with reference to FIG. 1.

Next, the tantalum film 910 is patterned via the resist mask RM2, and as shown in FIG. 3(E), a gate electrode 19 is formed As a result, part of the tantalum film 910 corresponding to the opening RM2' of the resist mask RM2 is also etched, and the gate electrode 19 is formed that is divided by a space 190 into the first gate electrode 191 and the second gate electrode 192.

Next, as shown in FIG. 3(F), low-concentration impurity ions (phosphorus ions) are implanted with a dose of approximately $0.1\times10^{13}$/cm$^2$ to $10\times10^{13}$/cm$^2$ with the gate electrode 19 as a mask, forming a low-concentration source domain 161 and a low-concentrion drain domain 171 with an impurity concentration of approximately $3\times10^{17}$/cm$^3$ self-aligned to the gate electrode 19. Also, because impurity is introduced into the semiconductor film 10a also through the space 190 of the gate electrode 19, a channel domain 15 is formed that is divided by a low-concentration domain 150 with impurity concentration of approximately $3\times10^{17}$/cm$^3$ into the first channel domain 151 and the second channel domain 152.

Next, as shown in FIG. 4(A), a wider resist mask RM3 is formed only in the drain-domain side closer to the gate electrode 19, and high-concentration impurity ions (phosphorus ions) are implanted with a dose of approximately $1\times10^{15}$/cm$^2$ to $10\times10^{15}$/cm$^2$, forming a high-concentration source domain 162 and drain domain 172. As a result, as shown in FIG. 4(B), a drain domain 17 is formed that is equipped with a low-concentration drain domain 171 and a high-concentration drain domain 172, and a high-concentration source domain 162 (source domain 16) is also formed that is self-aligned to the gate electrode 19.

Next, as shown in FIG. 4(C), on the front side of the gate electrode 19, an interlayer insulation film 18 is formed that is made of oxidized silicon film, NSG film, etc. with thickness of approximately 300 nm to 1500 nm by using the CVD method etc., and additionally, a resist mask RM4 is formed on the interlayer insulation film 18 using photolithography technology for forming a contact hole.

Next, the interlayer insulation film 18 is etched via the resist mask RM4, and as shown in FIG. 4(D), contact holes 18a and 18b are respectively formed on the parts of the interlayer insulation film 18 corresponding to the high-concentration source domain 162 and the high-concentration drain domain 172.

Next, as shown in FIG. 4(E), an aluminum film 900 is formed by the sputtering method etc. on the front side of the interlayer insulation film 18 for constructing a source electrode etc., and additionally a resist mask RM5 is formed using photolithography technology.

Next, the aluminum 900 is etched via the resist mask RM5, and as shown in FIG. 1, a source electrode 12 is formed that is made of an aluminum flm electrically connected to the high-concentration source domain 162 via the contact hole 18a, and a drain electrode 14 is formed that is electrically connected to the high-concentration drain domain 172 via the contact hole 18b.

As a result, it is possible to manufacture a TFT where the gate electrode 19 and the channel domain 15 are plurally divided in the channel-length direction, the low-concentration domain 150 is formed between the divided channel domains 15, and the low-concentration drain domain 161 adjoins the second channel domain 152 located closest to the drain domain 17 side among the divided channel domains 15. With this kind of manufacturing method, the TFT 10 in this embodiment can be manufactured through the same number of processes with the conventional LDD-structure TFT explained with reference to FIG. 7 and FIG. 8.

As explained above, in the TFT relating to this invention, because a gate electrode and a channel domain are divided plurally in the channel-length direction a low-concentration domain is formed between the divided channel domains, and a low-concentration drain domain with a low impurity concentration adjoins the channel domain located closest to the drain domain side among the divided channel domains, an abnormal increase of drain current in the saturation region can be prevented even if the impurity concentration is relatively high in the low-concentration domain located between the divided channel domains and the low-concentration drain domain Therefore, in the TFT relating to this invention, because the impurity concentration does not have to be lowered to the extent that the drain current becomes low, stable drain current can be obtained in the saturated region, and this drain current level is high. Therefore, it is possible to realize a TFT that has high reliability and can achieve high-speed operation when used in a driving circuit.

What is claimed is:

1. A thin-film transistor, comprising:
    a channel domain facing a gate electrode across a gate insulation film and a source/drain domain connected to the channel domain that are formed on a semiconductor film formed on the surface of a insulating substrate, said gate electrode and said channel domain being divided plurally in the channel-length direction;
    a low-concentration domain that is formed between the divided channel domains including a semiconductor film with a low impurity concentration; and
    a low-concentration drain domain having a low impurity concentration that adjoins the channel domain located closest to a drain-domain side among said divided channel domains, wherein
        the channel-length-direction dimensions of the gate electrode and the channel domain located in the drain domain side are shorter than in the channel-length-direction dimensions of the gate electrode and the channel domain located in the source domain side among said divided gate electrodes and channel domains.

2. The thin-film transistor in claim 1, wherein said gate electrode and channel domain are divided in two so that the ratio between the channel-length-direction dimensions of the gate electrode and the channel domain located in the drain domain side and the channel-length-direction dimensions of the gate electrode and the channel domain located in the source domain side is between 1:2 and 1:10.

3. The thin-film transistor in claim 1, wherein said source domain adjoining the channel domain is a high-concentration source domain.

4. The thin-film transistor in claim 1, wherein the channel-length-direction dimension of said low-concentration drain domain and the channel-length-direction dimension of the low-concentration domain located between said channel domains are substantially equal to each other.

5. The thin-film transistor in claim 1, wherein the impurity concentration of said low-concentration domain and said low-concentration drain domain are generally $3\times10^{17}$ cm$^{-3}$ and $3\times10^{19}$ cm$^{-3}$.

6. The thin-film transistor in claim 1, wherein the impurity concentration of said low-concentration domain and said low-concentration drain domain are generally between $1\times10^{18}$ cm$^{-3}$ and $3\times10^{19}$ cm$^{-3}$.

7. The thin-film transistor in claim 2, wherein said source domain adjoining the channel domain is a high-concentration source domain.

8. The thin-film transistor in claim 2, wherein the channel-length-direction dimension of said low-concentration drain domain and the channel-length-direction dimension of the low-concentration domain located between said channel domains are substantially equal to each other.

9. The thin-film transistor in claim 2, wherein the impurity concentration of said low-concentration domain and said low-concentration drain domain are generally $3\times10^{17}$ cm$^{-3}$ and $3\times10^{19}$ cm$^{-3}$.

10. The thin-film transistor in claim 2, wherein the impurity concentration of said low-concentration domain and said low-concentration drain domain are generally between $1\times10^{18}$ cm$^{-3}$ and $3\times10^{19}$ cm$^{-3}$.

11. A method of manufacturing a thin-film transistor comprising forming a semiconductor film on an insulating substrate:
    forming a gate insulating film on the semiconductor film;
    forming a gate electrode on the gate insulation film to provide a channel domain in the semiconductor film, the gate electrode being divided plurally in the channel-length direction;
    introducing a low-concentration impurity to said semiconductor film using the gate electrode as a mask to divide said channel domain plurally in the channel length direction and form a low-concentration domain between the divided channel domains and to form a low-concentration drain domain that adjoins one of the divided channel domains;
    forming source and drain domains in the semiconductor film whereby the said one of the channel domainsadjoining the low-concentration drain domain is located closest to the drain domain, wherein
        the channel-length-direction dimensions of the gate electrode and the said one of the divided channel domains are formed to be shorter than the channel-length-direction dimensions of the gate electrode and the channel domain located in the source domain side among said divided gate electrodes and channel domains.

12. The method of manufacturing a thin-film transistor in claim 11, wherein said gate electrode and channel domain are divided in two so that the ratio between the channel-length-direction dimensions of the gate electrode and the said one of the channel domains and the channel-length-direction dimensions of the gate electrode and the channel domain located in the source domain side is between 1:2 and 1:10.

* * * * *

UNITED STATES PATENT AND TRADEMARK OFFICE
CERTIFICATE OF CORRECTION

PATENT NO.     : 6,580,129 B2
DATED          : June 17, 2003
INVENTOR(S)    : Basil Lui et al.

It is certified that error appears in the above-identified patent and that said Letters Patent is hereby corrected as shown below:

<u>Title page,</u>
Item [75], change "Basil Lui, Cambridge (GB)" to -- Basil Lui, Singapore (SG) --.

Signed and Sealed this

Ninth Day of December, 2003

JAMES E. ROGAN
*Director of the United States Patent and Trademark Office*